United States Patent [19]

Noro

[11] Patent Number: 4,812,846
[45] Date of Patent: Mar. 14, 1989

[54] DITHER CIRCUIT USING DITHER INCLUDING SIGNAL COMPONENT HAVING FREQUENCY HALF OF SAMPLING FREQUENCY

[75] Inventor: Masao Noro, Hamamatsu, Japan
[73] Assignee: Yamaha Corporation, Hamamatsu, Japan
[21] Appl. No.: 220,419
[22] Filed: Jul. 19, 1988

Related U.S. Application Data

[63] Continuation of Ser. No. 945,375, Dec. 22, 1986, abandoned.

[30] Foreign Application Priority Data

Jan. 8, 1986 [JP] Japan .................................. 61-1801

[51] Int. Cl.$^4$ ........................................... H03K 13/00
[52] U.S. Cl. .................................................. 341/131
[58] Field of Search .... 340/347 R, 347 AD, 347 DA, 340/347 C, 347 CC

[56] References Cited

U.S. PATENT DOCUMENTS 3,877,022  4/1975  Lehman et al. ............ 340/347 M X

OTHER PUBLICATIONS

Ando et al., Article concerning the Application of Dither to Audio Signals, The Journal of the Acoustical Society of Japan, vol. 39, No. 7, 1983, pp. 452–462.

Primary Examiner—Vit W. Miska
Attorney, Agent, or Firm—Spensley Horn Jubas & Lubitz

[57] ABSTRACT

A dither circuit for improving linearity in A/D or D/A conversion by adding dither to an input signal of an A/D or D/A converter and subtracting dither from an output signal of the A/D or D/A converter. The dither circuit comprises a ½ Fs signal generator for generating a ½ Fs signal having a frequency which is ½ of a sampling frequency Fs, a noise generator for generating random noise in digital form and an adder for adding the ½ Fs signal and the random noise together and supplying a resulting sum signal to the adder and subtractor as dither. According to this invention, a conversion error is reduced with a result that the random noise can be of a small level. Thus, high accuracy requirement in a practical circuit construction is reduced so that the circuit construction is easily performed.

6 Claims, 4 Drawing Sheets

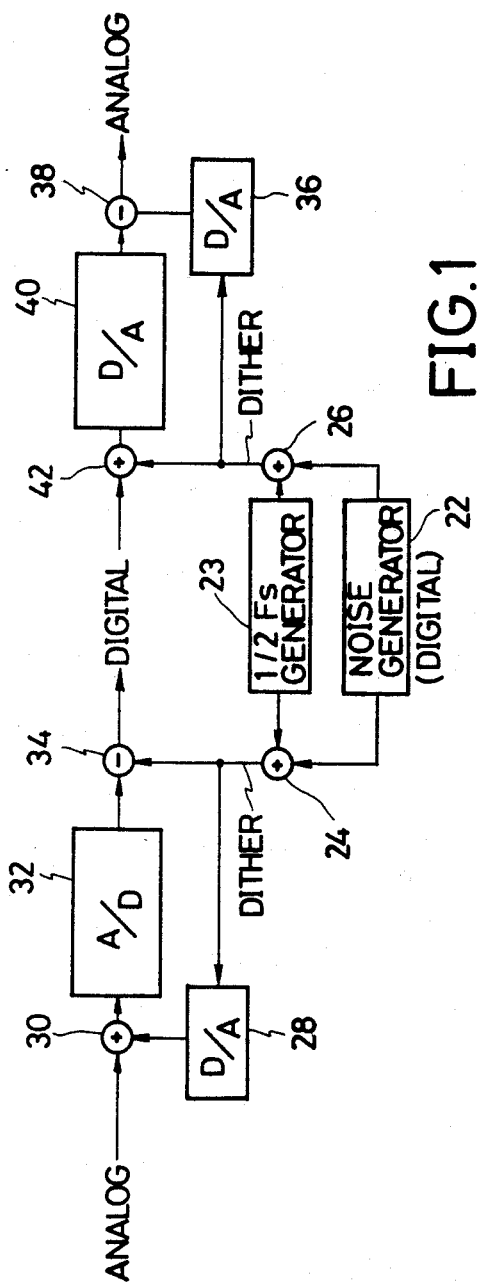
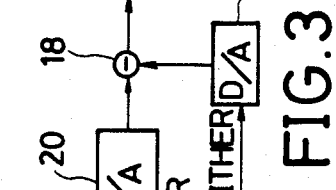
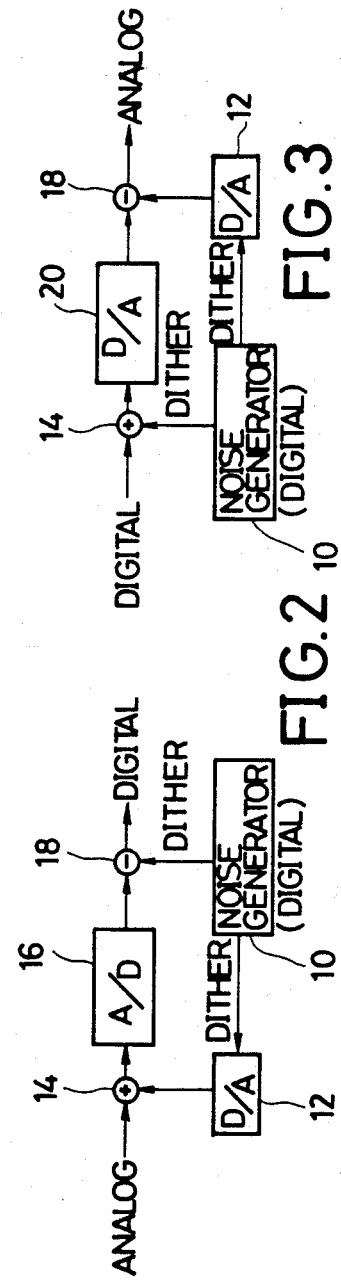

4,812,846

DITHER CIRCUIT USING DITHER INCLUDING SIGNAL COMPONENT HAVING FREQUENCY HALF OF SAMPLING FREQUENCY

This is a continuation of copending application Ser. No. 945,375 filed on Dec. 22, 1986, now abandoned.

BACKGROUND OF THE INVENTION

Tis invention relates to an improvement in a dither circuit employed for improving linearity in analog-to-digital (A/D) or digital-to-analog (D/A) conversion of a signal and, more particularly, to a dither circuit capable of reducing an error in a small signal and also reducing an adverse effect of error in accuracy in addition and subtraction in analog thereby to facilitate practical application of dither.

In A/D or D/A conversion, quantizing noise is inherently generated. As is well known, the quantizing noise becomes a white noise which is uncorrelated with a singal to be converted if the signal is of a large level whereas the quanitizing noise becomes distortion which is greatly correlated with the signal if the signal is of a relatively small level and this noise adversely affects the quality of tone when the signal is sounded in an audio apparatus.

For overcoming this problem, employment of a dither circuit with an A/D or D/A converter is proposed. A dither circuit superposes dither (noise signal) on an input signal before A/D or D/A conversion and subtracts dither from an output signal after the conversion (in a case of a subtraction type dither circuit). By way of example, in the case of A/D conversion, as shown in FIG. 2, dither (digital signal) generated by a noise generator 10 is converted to an analog signal by a D/A converter 12 and the converted dither is superposed on an input analog signal by an adder 14. After the input signal superposed with dither is A/D-converted by an A/D converter 16, dither is subtracted from the output of the A/D converter 16 by a subtractor 18 whereby a digital signal corresponding to the input analog signal is derived.

In a case of D/A conversion, as shown in FIG. 3, dither (digital signal) generated by a noise generator 10 is superposed on an input digital signal by an adder 14, the input signal superposed with dither is D/A-converted by a D/A converter 20, and dither D/A converted by a D/A converter 12 is subtracted from the output of the D/A converter 20 by a subtractor 18 whereby an analog signal corresponding to the input digital signal is derived.

Dither in a classical sense of the term is a technique used for reducing a quantizing noise accompanying a quantizing error and there are two types of dither, i.e., dither which imparts simply an amplitude noise for LSB (least significant bit) one bit incidentally, (the noise level naturally increases) and dither according to which noise is superposed on an input signal and its noise is subtracted after A/D or D/A conversion to prevent increase in the noise level.

If an A/D or D/A converter is ideally manufactured, the amplitude of noise used for dither can be $\pm\frac{1}{2}$ LSB. In practice, however, an amplitude which is sufficiently larger than this value has proved more effective. This is because a converter of sixteen bits, for example, has not necessarily an accuracy of sixteen bits but the accuracy generally drops to fourteen to fifteen bits. Dither of a large amplitude is effective for such converter because a conversion error is dispersed by using such dither of a large amplitude as compared with a case where ordinary dither is used so that monotonousness of the converter is overcome and its linearity is improved.

If, as shown in FIG. 4, there exists a conversion error in an A/D converter, an output digital signal S' is distorted against an input analog signal S of a small amplitude. By superposing dither D of a large amplitude on the input signal S, the conversion is made with a broad range B instead of a range A which is a case where no dither is used (dither is subtracted after the conversion) so that the conversion error is dispersed and linearity is thereby improved. Accordingly, an A/D or D/A converter of less accuracy requires dither of a larger amplitude.

Factors determining accuracy of A/D and D/A converters will now be considered.

Since an A/D converter is generally composed of a D/A converter and a feedback circuit, its accuracy is greatly influenced by the D/A converter.

Accuracy of a D/A converter is generally attained by resistance trimming. As a result, the severest accuracy is required for resistance corresponding to MSB (most significant bit) at which the largest weighting is placed. Consequently, most D/A converters generate the largest error when MSB is switched. Besides, since the accuracy of the D/A converter is attained one by one by trimming, the conversion error becomes irregular with its value differing one converter from another.

The same applies to an A/D converter which uses a D/A converter. Moreover, since the D/A converter is operated the number of times corresponding to its bit number for a single A/D conversion, it is operated at such a high speed that its accuracy in conversion is generally decreased even further than a D/A converter so that necessity for dither is even higher than in a D/A converter.

Particularly in a PCM audio device such as a Compact Disc Digital Audio System and a digital audio tape recorder, MSB is used as a sign bit representing the polarity of a signal and is switched at zero crossing of an input signal so that influence of an error occurring at MSB over the quality of a tone produced is extremely great.

Since the purpose of dither is improvement in characteristics of a small signal, dither will become meaningless unless it is effective against such conversion error occurring at MSB. As described above, in view of the facts that there is a high probability that a conversion error at MSB is the largest of errors occurring in A/D and D/A converters and that there is irregularity in the accuracy of converters, dither of a substantially large amplitude must be applied.

Use of dither of such large amplitude, however, is extremely difficult in practical application to converters actually manufactured. Because, dither is added and subtracted in prior and posterior stages of a converter with at least either of one of the addition and subtraction being effected in analog and accuracy in such analog addition and subtraction becomes a problem. Namely, since a trimming error tends to occur in dither used for addition or subtraction which is produced by D/A-converting an output signal of a noise generator, an accurate subtraction becomes difficult. For this reason, it is difficult to realize dither exceeding a certain value (i.e., a certain bit number) in view of this irregularity in conversion error, even though dither of a large amplitude is generally desirable.

In actually manufacturing a converter, it is desirable that only a rough adjustment of a product suffice but, this rough adjustment poses problems in an absolute accuracy in the analog addition and subtraction. Accordingly, it is difficult to realize a large amplitude dither in practical use.

For overcoming this problem, band concentration dither has been proposed. According to this proposal, noise of a band which is substantially inaudible (generally a high frequency band) is used as dither. This method, however, has the problem that construction of a generator producing such noise becomes complicated.

It is, therefore, an object of the invention to provide a dither circuit overcoming these problems and being capable of reducing error in a small signal and also reducing influence of errors such as error in addition or subtraction of dither in analog.

SUMMARY OF THE INVENTION

For achieving the above described object of the invention, it is a basic feature of the invention to use, for the purpose of dither, a signal derived by adding a signal of a frequency of $\frac{1}{2}$ Fs (Fs representing sampling frequency) to a random noise.

A dither circuit achieving the object of the invention is characterized in that it comprises an A/D or D/A converter, an adder provided in a prior stage to the A/D or D/A converter, a subtractor provided in a posterior stage to the A/D or D/A converter, and dither supplying means for supplying dither to the adder and subtractor, the dither supplying means comprising a $\frac{1}{2}$ Fs signal generator for generating a $\frac{1}{2}$ Fs signal having a frequency which is $\frac{1}{2}$ of a sampling frequency Fs, a noise generator for generating random noise in digital, and an adder for adding the $\frac{1}{2}$ Fs signal and the random noise together and supplying a resulting sum signal to the adder and subtractor as dither.

As described above, there is high probability that error in an A/D or D/A converter becomes the largest at a point at which MSB is switched and it generally becomes smaller as the bit position is nearer to LSB, for weighting becomes smaller as the bit position is nearer to LSB.

FIG. 5 shows points at which error tends to become large among all bits. In the figure, $\underline{A}$ represents a switching point of MSB, $\underline{B}$ a switching point of the second bit, $\underline{C}$ a switching point of the third bit and $\underline{D}$ a switching point of the fourth bit respectively. Absolute values of the error A, B, C and D at the respective points $\underline{A}, \underline{B}, \underline{C}$ and $\underline{D}$ often becomes $A>B>C>D$.

As will be apparent from FIG. 5, a region in the vicinity of the zero crossing point is one in which error is relatively small except for the point $\underline{A}$. It is therefore conceived that use of the point $\underline{A}$ should be avoided when a signal to be converted is a small signal. By avoiding use of the point $\underline{A}$, error can be reduced with resulting improvement in the accuracy and, accordingly, dither can be sufficiently effective with a relatively small amplitude.

The simplest way for avoiding the point $\underline{A}$ is to superpose a DC voltage on an input signal and avoid the point $\underline{A}$ by DC offsetting. This method, however, has the problems that a clipping level of the waveshape is not coincidental between a positive side and a negative side and that distortion increases sharply when the point $\underline{A}$ is passed if the level of the signal exceeds a certain level, though there is no such problem when the level of the signal is very small.

In the present invention, not only noise but also a frequency signal of $\frac{1}{2}$ Fs synchronized with a sampling frequency Fs in A/D or D/A conversion are superposed on an input signal. Peak points of the $\frac{1}{2}$ Fs signal sampled by the sampling frequency Fs are as shown in FIG. 6. Since this $\frac{1}{2}$ Fs signal is synchronized with the sampling frequency Fs, there can be only two values as values sampled by the sampling frequency Fs.

A state in which the $\frac{1}{2}$ Fs signal has been applied to an A/D converter is shown in FIG. 7. From FIG. 7, it will be understood that the waveform can be converted by using only two points of $a_1$ and $a_2$.

Nextly, description will be made about a case where a signal of a small amplitude is converted by utilizing this $\frac{1}{2}$ Fs signal as a large amplitude dither. FIG. 8 shows a case where a signal of a small amplitude superposed with the $\frac{1}{2}$ Fs signal is A/D-converted. By removing the $\frac{1}{2}$ Fs signal from the A/D converted output, the signal has been converted without using the point $\underline{A}$ and without using the DC offsetting. Besides, since the conversion is performed by not only avoiding the point $\underline{A}$ but using the region near the two points of $a_1$ and $a_2$, this contributes to improvement in linearity which is expected for dither.

If the amplitude of the input signal increases, the point $\underline{A}$ must be used after all. Even in this case, however, the dither circuit according to the present invention is advantageous over the DC offsetting in the following two points:

One advantage is that a $\frac{1}{2}$ Fs signal of a relatively large amplitude can be superposed on an input signal and, accordingly, the signal can use the point $\underline{A}$ with a relatively large level. This is because the frequency of $\frac{1}{2}$ Fs is the highest frequency at which a signal can be transmitted according to the sampling theorem and a low-pass filter after D/A conversion is so designed that it has a sufficient amount of attenuation at the frequency of $\frac{1}{2}$ Fs and, accordingly, the $\frac{1}{2}$ Fs signal can be removed by the low-pass filter even if it is not completely removed by subtraction after the conversion so that it becomes a level which does not practically pose a problem. Besides, quantizing noise of a relatively large level occurring at the point $\underline{A}$ tends to become uncorrelated to the input signal since the signal level is relatively large so that it does not adversely affect hearing as in the case of an input signal of a small level.

The other advantage is that in the case of superposing by DC offsetting, non-linearity at the point $\underline{A}$ concentrates at one point in a signal waveform and therefore tends to be correlated with the signal whereas in the case of superposing of a $\frac{1}{2}$ Fs signal, distortion is dispersed owing to the dither effect so that it gives little offense to the ear.

By removing the adverse effect at the point $\underline{A}$ by a $\frac{1}{2}$ Fs signal of a large amplitude, dither by a proper random noise can be sufficiently effective with a relatively small amplitude and, accordingly, addition and subtraction of dither with such a high accuracy is not required because the amplitude of random noise is relatively small and this is convenient for practical application of the dither circuit to an A/D or D/A converter.

BRIEF DESCRIPTION OF THE DRAWINGS

In the accompanying drawings,

FIG. 1 is a block diagram showing an embodiment of the invention;

FIG. 2 is a block diagram showing an A/D converter comprising a prior art dither circuit;

FIG. 3 is a block diagram showing a D/A converter comprising a prior art dither circuit;

DESCRIPTION OF A PREFERRED EMBODIMENT

Figure 4:
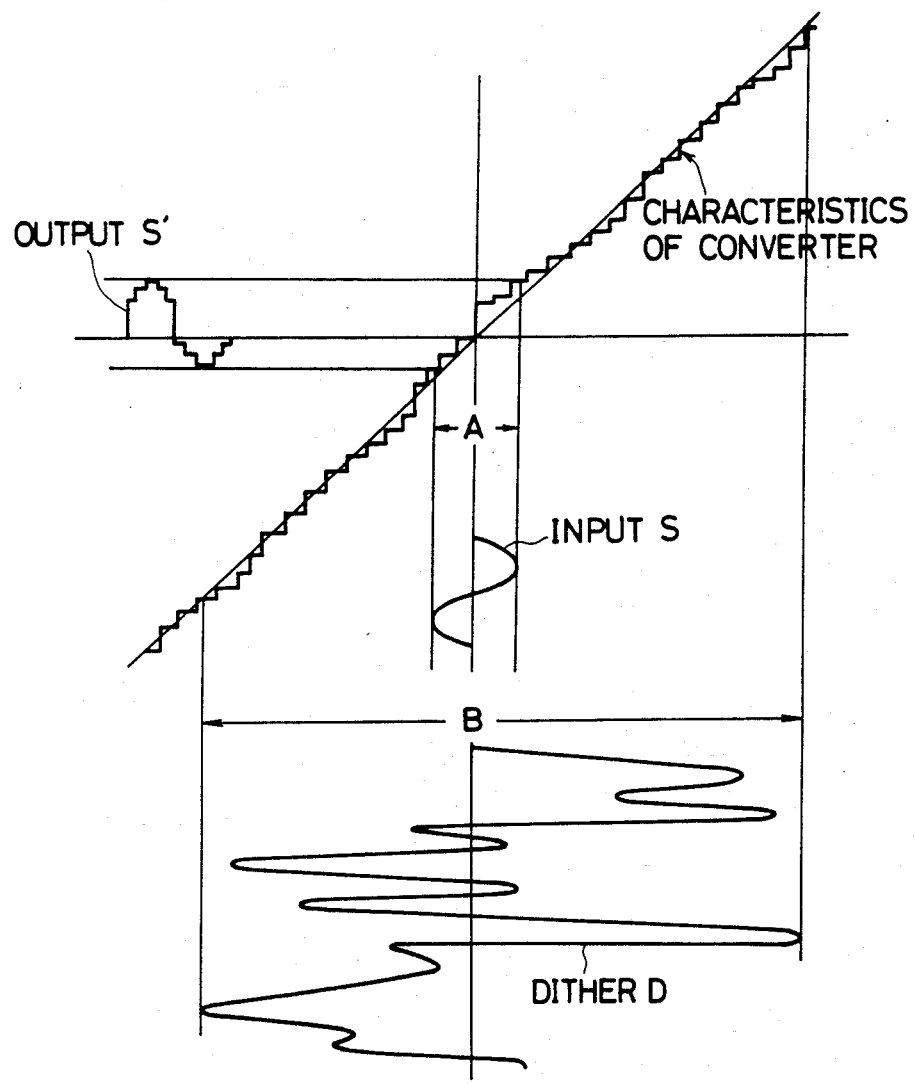
FIG. 4 is a diagram showing a conversion error in an A/D converter.
Figure 5:
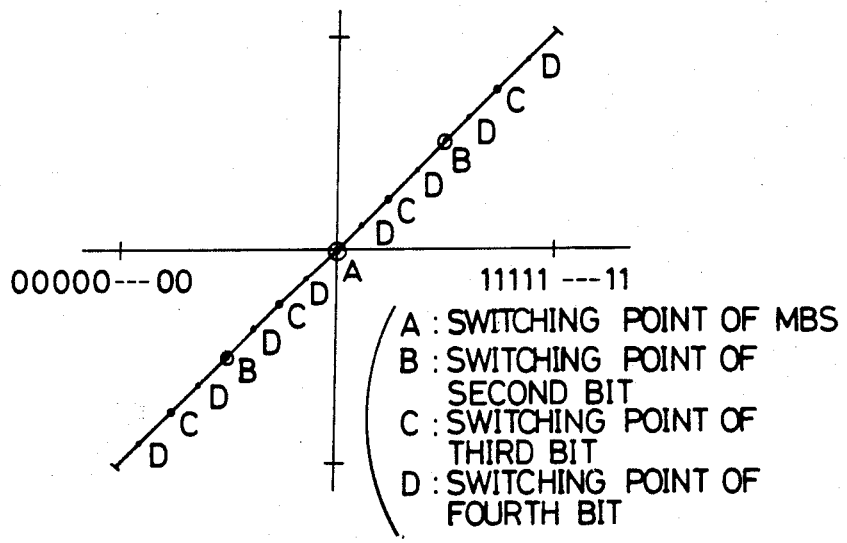
FIG. 5 is a diagram showing a region in which conversion error in A/D or D/A conversion is large.
Figure 6:
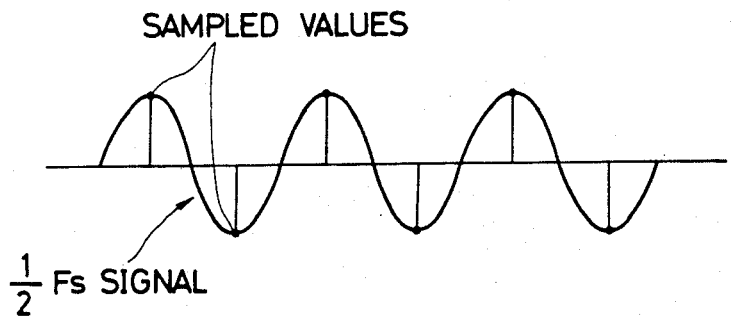
FIG. 6 is a diagram showing a state in which peak points of a ½ Fs signal are sampled with a sampling frequency Fs.
Figure 7:
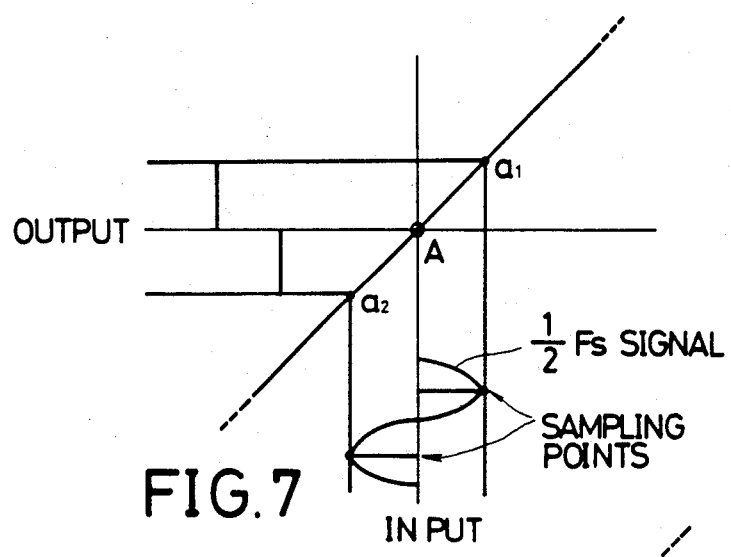
FIG. 7 is a diagram showing a state in which a ½ Fs signal has been applied to an A/D converter.

A preferred embodiment of the invention is shown in FIG. 1. In the construction shown in FIG. 1, an input analog signal is A/D-converted and a digital signal which is an output of the A/D converter is D/A-converted to the original analog signal.

In FIG. 1, a noise generator 22 produces random noise as a digital signal. A ½ Fs generator 23 produces a ½ Fs signal which is a digital signal of a frequency which is ½ of a sampling frequency Fs. These signals are added together by adders 24 and 26 respectively to form dither.

Dither is converted to an analog signal by a D/A converter 28 and superposed on an input analog signal by an adder 30. A signal superposed with dither is converted to a digital signal by an A/D converter 32. Dither is subtracted from the converted digital signal by a subtractor 34 whereby a digital signal corresponding to the input analog signal is derived.

Dither is also superposed on the input digital signal by an adder 42. The signal superposed with dither is converted to an analog signal by a D/A converter 40. Dither is converted to an analog signal by a D/A converter 36. Dither is then subtracted from the output analog signal from the D/A converter 40 by a subtractor 38 whereby an analog signal corresponding to the input digital signal is derived.

Figure 8:
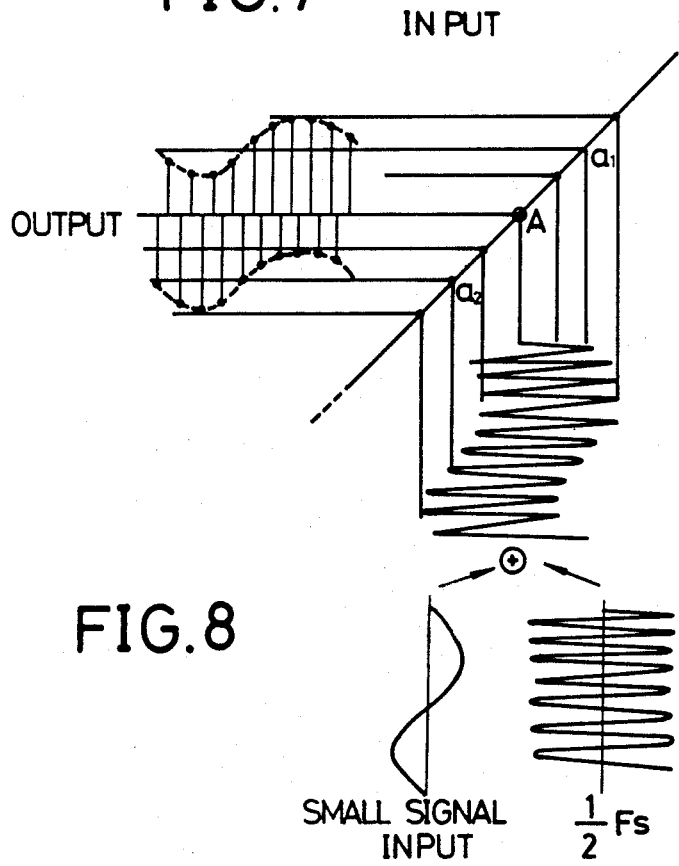
FIG. 8 is a diagram showing a state in which a signal of a small amplitude is A/D-converted using a ½ Fs signal as dither.

Since a D/A converter (not shown) in the A/D converter 32 treats a signal superposed with a ½ Fs signal, the conversion in which the point A is avoided is performed when the input signal to be converted is a small signal as shown in FIG. 8. By avoiding the point A at which the largest weighting is placed and therefore the largest error is likely to occur in conversion, the conversion error can be held at the minimum. Since the conversion error is thus held at the minimum, the noise generator 22 has only to superpose random noise of a relatively small amplitude. This reduces requirement for a high accuracy in the digital adder 30 and the D/A converter 28 with resulting ease in practical application of the dither circuit to an A/D or D/A converter. Since errors in addition and subtraction of the ½ Fs signal in these adder 30 and D/A converter 28 can be sufficiently removed by a filter provided in a posterior stage as described above, the requirement for a high accuracy in the adder 30 and D/A converter 28 is further reduced.

As for the D/A converter 40, the converter 40 likewise treats a signal superposed with the ½ Fs signal so that conversion in which the point A is avoided is performed when the input signal is a small signal as shown in FIG. 8. Consequently, the same effect as described above with respect to the D/A converter in the A/D converter 32 is obtained and requirement for a high accuracy in the digital subtractor 38 and the D/A converter 36 is reduced.

As described above, by superposing the ½ Fs signal, use of a portion in which a large conversion error occurs can be avoided whereby the conversion can be made with only a small conversion error. Besides, since the conversion error is small, random noise to be superposed can be of a relatively small level and requirement for a high accuracy in the digital adder 30, digital subtractor 38 and D/A converters 28 and 36 is reduced with resulting ease in application of the dither circuit to an A/D or D/A converter.

What is claimed is:

1. A dither circuit comprising:
    an A/D converter;
    an adder provided in a prior stage to said A/D converter;
    a subtractor provided in a posterior stage to said A/D converter; and
    dither supplying means for supplying dither to said adder and subtractor, said dither supplying means comprising:
    a ½ Fs signal generator for generating a ½ Fs signal having a frequency which is ½ of a sampling frequency Fs to provide a first dither component;
    a noise generator for generating random noise to provide a second dither component; and
    an adder for adding the ½ Fs signals and the random noise together and supplying a resulting sum signal to said adder and subtractor as dither, said dither including said first and second dither components to increase conversion linearity and reduce quantizing noise.

2. A dither circuit as defined in claim 1 wherein said dither supplying means further comprises a D/A converter connected to said adder provided in a prior stage to said A/D converter for converting the dither supplied from said dither supplying means to an analog signal.

3. A dither circuit as defined in claim 1 wherein said dither supplying means further comprises a D/A converter connected to said subtractor for converting the dither supplied from said dither supplying means to an analog signal.

4. A dither circuit comprising:
    a D/A converter;
    an adder provided in a prior stage to said D/A converter;
    a subtractor provided in a posterior stage to said D/A converter; and
    dither supplying means for supplying dither to said adder and subtractor, said dither supplying means comprising:
    a ½ Fs signal generator for generating a ½ Fs signal having a frequency which is ½ of a sampling frequency Fs to provide a first dither component;
    a noise generator for generating random noise to provide a second dither component; and
    an adder for adding the ½ Fs signal and the random noise together and supplying a resulting sum signal to said adder and subtractor as dither, said dither including said first and second dither components to increase conversion linearity and reduce quantizing noise.

5. An analog-to-digital conversion circuit including subtractive-type dither comprising:
    an analog-to-digital converter;

dither supplying means for supplying dither, said dither supplying means including (a) a ½ Fs generator for generating a first dither component comprised of a periodic signal of relatively large amplitude and a frequency which is ½ of sampling frequency of said analog-to-digital converter, and (b) a noise generator for generating a second dither component comprised of a noise signal of relatively small amplitude;

an adder for adding the dither to an analog input signal, wherein the output of the adder is provided to the analog-to-digital converter; and a subtractor for subtracting the dither from the output of the analog-to-digital converter, said circuit providing improved conversion accuracy and reduced quantization noise.

6. An digital-to-analog conversion circuit including subtractive-type dither comprising:

a digital-to-analog converter;

dither supplying means for supplying dither, said dither supplying means including (a) a ½ Fs generator for generating a first dither component comprised of a periodic signal of relatively large amplitude and a frequency which is ½ of a sampling frequency of said digital-to-analog converter, and (b) a noise generator for generating a second dither component comprised of a noise signal of relatively small amplitude;

an adder for adding the dither to an digital input signal, wherein the output of the adder is provided to the digital-to-analog converter; and a subtractor for subtracting the dither from the output of the digital-to-analog converter, said circuit providing improved conversion accuracy and reduced quantization noise.

* * * * *